(12) United States Patent
Inaba

(10) Patent No.: US 6,494,768 B2
(45) Date of Patent: Dec. 17, 2002

(54) WAFER POLISHING APPARATUS

(75) Inventor: Takao Inaba, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 09/789,279

(22) Filed: Feb. 20, 2001

(65) Prior Publication Data

US 2001/0024938 A1 Sep. 27, 2001

(30) Foreign Application Priority Data

Mar. 23, 2000 (JP) .......................................... 2000-082995

(51) Int. Cl.$^7$ ............................................... B24B 29/00
(52) U.S. Cl. ........................... 451/287; 451/57; 451/66; 451/285
(58) Field of Search ............................. 451/57, 66, 285, 451/287, 288, 289, 41, 54, 67, 339, 335

(56) References Cited

U.S. PATENT DOCUMENTS

| 5,329,732 A | 7/1994 | Karlsrud et al. |
| 5,908,347 A | * 6/1999 | Nakajima et al. ........... 451/285 |
| 6,086,457 A | * 7/2000 | Perlov et al. ................ 451/285 |
| 6,213,853 B1 | * 4/2001 | Gonzalez-Martin et al. 451/287 |
| 6,273,802 B1 | * 8/2001 | Okumura et al. ........... 451/287 |

FOREIGN PATENT DOCUMENTS

| GB | 2 234 470 A | 2/1991 |
| GB | 2 345 873 A | 7/2000 |
| JP | 10166264 A | 6/1998 |
| JP | 2000124172 A | 4/2000 |

* cited by examiner

Primary Examiner—Timothy V. Eley
Assistant Examiner—Alvin J Grant
(74) Attorney, Agent, or Firm—Christie, Parker & Hale, LLP

(57) ABSTRACT

A wafer polishing apparatus according to this invention has a polishing unit that includes three platens and two polishing heads. Injection ports are disposed between the platens. The two polishing heads can linearly move between the platens. In a two-step polishing process, while the polishing head holds a wafer after polishing by a platen, the wafer is transferred to a center platen which provides different polishing characteristics. In this instance, washing water from the injection ports washes away slurry, etc, adhering to the wafer. The wafer is then carried to the center platen beyond a waiting unit and is subjected to further polishing.

1 Claim, 3 Drawing Sheets

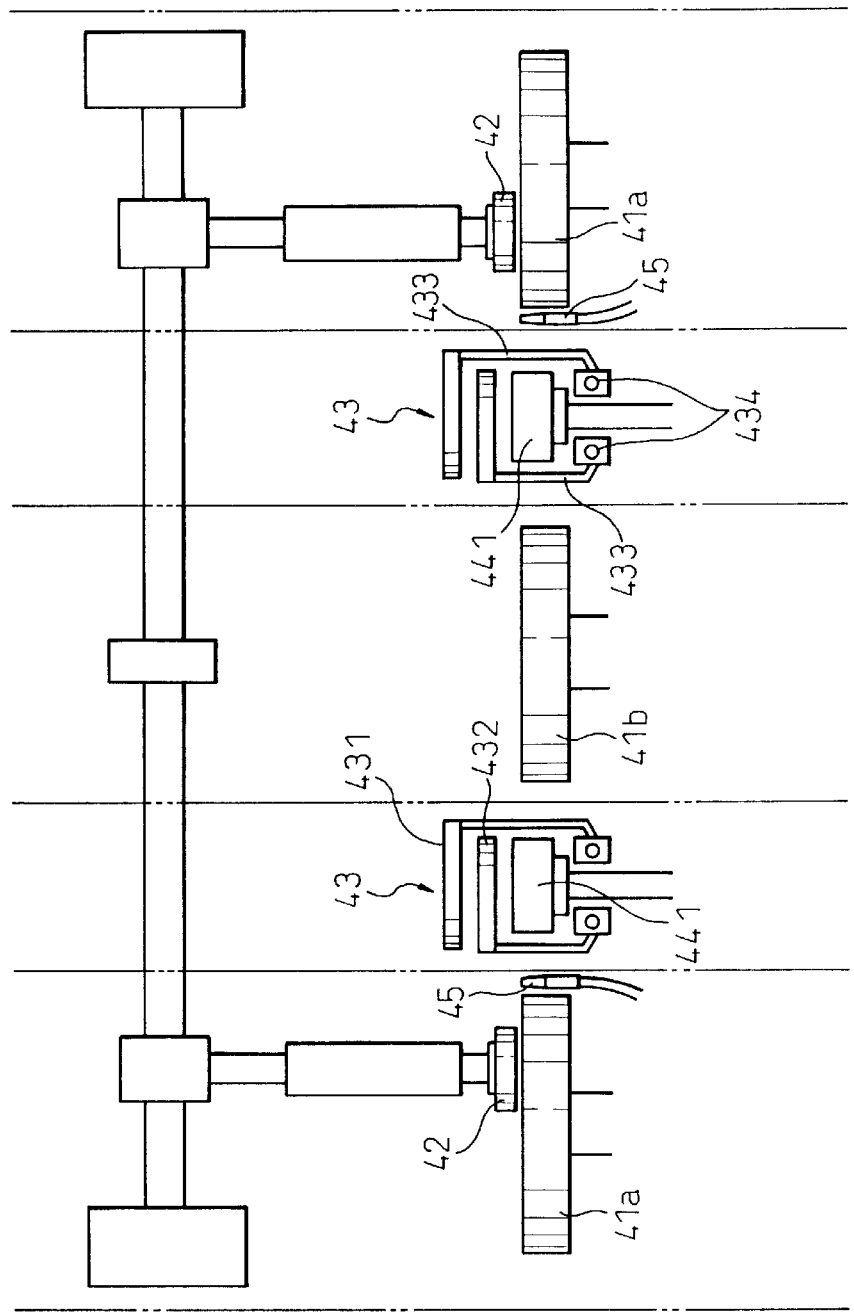

WAFER POLISHING APPARATUS

CROSS-REFERENCE TO RELATED APPLICATION

This application claims priority of Japanese patent application number 2000-082995, filed Mar. 23, 2000.

BACKGROUND OF THE INVENTION

1. Field of the Invention

This invention relates to a wafer polishing apparatus. More particularly, this invention relates to a polishing apparatus, for semiconductor wafers, using chemical mechanical polishing (CMP).

2. Description of the Related Art

Miniaturization of ICs (integrated circuits) has made progress in recent years, and IC patterns are being formed in multiple layers. A surface of the layer on which such a pattern is formed unavoidably has an unevenness to a certain extent. According to the prior art technology, a pattern is formed on a previous layer. However, the greater the number of layers and the smaller the widths of lines and the diameters of holes, the more difficult it becomes to form satisfactory patterns and the more likely it becomes for defects to occur. Therefore, it is a customary practice to planarize the surface of a layer having a pattern formed thereon and then to form the pattern of a next layer. A wafer polishing apparatus (CMP appartus) using a CMP method has been employed for polishing a wafer during the formation process of such an IC pattern.

The wafer polishing apparatus according to the prior art. includes only one platen. Therefore, when two-step polishing of the wafer is conducted, polishing of the wafer is first done by using specific slurry and is then done by changing the slurry. However, since the platen must be washed before the slurry is changed, polishing time is wasted and work efficiency is low.

A wafer polishing apparatus is also known that includes two or more platens and can change polishing characteristics for each platen. However, the wafer polishing apparatus carries the polished wafer to a next platen while the slurry used in a previous step remains adhering to the wafer, and polishing cannot be carried out satisfactorily. Alternatively, two-step polishing is conducted by carrying the polished wafer to a washing unit, and then carrying the washed wafer to a next platen. In this case, a loss occurs in the polishing steps and the polishing time becomes long because the wafer is carried into the washing unit whenever it is polished.

SUMMARY OF THE INVENTION

In view of the problems described above, it is an object of the present invention to provide a wafer washing apparatus capable of conducting high-precision multi-step polishing without inviting any waste in the polishing steps.

To solve the problems described above, a wafer polishing apparatus according to the present invention incorporates two or more platens in a polishing unit and includes injection ports for washing water at the boundaries between the platens. When two-step polishing of the wafer is carried out, washing water from the injection ports can wash the wafer while the as-polished wafer is held and conveyed by the polishing head to the next platen. Therefore, the wafer polishing apparatus can prevent slurry, etc, adhering to the wafer from being carried to the next polishing step, and can execute high-precision wafer polishing. The atmosphere inside the platen of the next polishing step is not contaminated, either.

Furthermore, the wafer polishing apparatus can execute multi-step polishing without a necessity for carrying the wafer to the washing unit whenever polishing is complete, and the time lost in the polishing step can be minimized.

The present invention may be more fully understood from the description of the preferred embodiment of the invention set forth below together with the accompanying drawings.

BRIEF DESCRIPTION OF THE DRAWINGS

In the drawings:

FIG. 3 is a schematic side view of the polishing unit of the present invention.

DESCRIPTION OF THE PREFERRED EMBODIMENT

Figure 1:
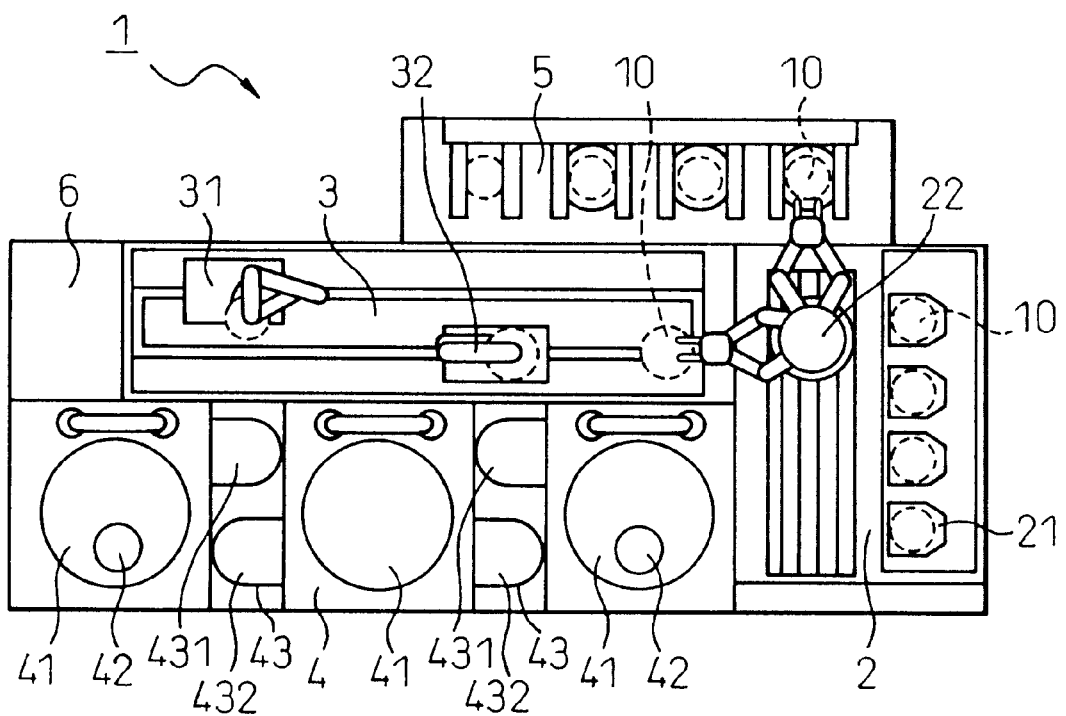
FIG. 1 is a schematic plan view of an overall construction of a wafer polishing apparatus according to an embodiment of the present invention.

FIG. 1 is a schematic plan view showing an overall construction of a wafer polishing apparatus. according to the present invention. The wafer polishing apparatus 1 comprises five units, that is, an index unit 2, a load/unload unit 3, a polishing unit 4, a washing unit 5 and an electric installation unit 6. Fitting devices individually fit each of these units.

The index unit 2 can be loaded with a plurality of cassettes 21. A robot 22 is fitted to the index unit 2 so as to take out the wafers 10 accommodated in the cassettes 21 and to carry them to the load/unload unit 3. The robot 22 receives the wafers 10 after polishing and washing from the washing unit 5, and returns them into the respective cassettes 21.

The load/unload unit 3 includes two, upper and lower, transfer robots 31 and 32. The upper-stage transfer robot 31 is used for loading (before wafer polishing) while the lower-stage transfer robot 32 is used for unloading (after wafer polishing). Each wafer from the index unit 2 is delivered to the upper-stage transfer robot 31. A pre-alignment table inside the load/unload unit 3, not shown, executes centering, and the wafer 10 is then conveyed to the polishing unit 4 by the upper-stage transfer robot 31.

The polishing unit 4 includes three platens 41 and two polishing heads 42. A waiting unit 43 having wafer placement tables having an upper-lower two-stage structure is disposed between the respective platens. Each wafer 10 conveyed to the polishing unit 4 is carried by the polishing heads 42 onto the platen 41 through the upper-stage wafer placement table 43a of the waiting unit 43 and is polished there. After polishing, the wafer 10 is taken out by the lower-stage transfer robot 32 of the load/unload unit 3 again through the lower-stage wafer placement table 43b of the waiting unit 43, and is then conveyed to the washing unit 5.

After washing is complete, the robot 22 of the index unit 2 accommodates the wafer 10 into the cassette 21. The above explains the outline of the one-step polishing process of the wafer-polishing apparatus 1 shown in FIG. 1.

Next, the construction of the polishing unit 4 as the feature of the wafer polishing apparatus of the present invention is explained in detail with reference to FIGS. 2 and 3.

Figure 2:
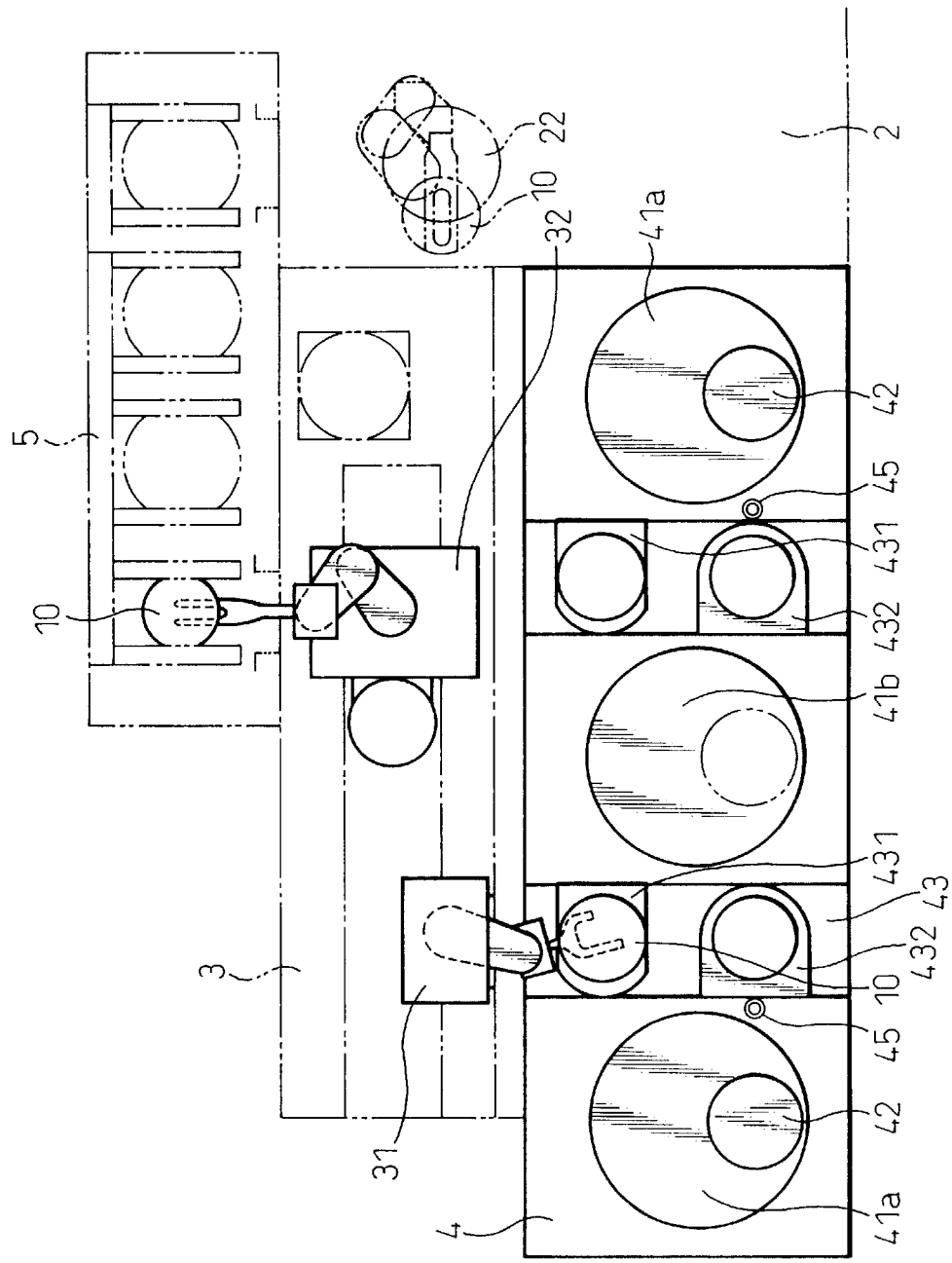
FIG. 2 is a schematic plan view of a polishing unit of the wafer polishing apparatus according to the present invention.

As shown in FIG. 2, the polishing unit 4 is equipped with three platens 41 and two polishing heads 42. When two-step polishing is conducted, the platens 41a on both right and left sides use the same kind of slurry while the center platen 41b uses a different kind of slurry so that polishing characteristics can be changed. Quite naturally, the degree of cleanness of individual chambers accommodating these platens can be changed in accordance with the polishing characteristics.

The polishing head 42 for holding the wafer 10 can linearly move between the platens and can also move up and down by a ball-screw structure, for example.

The polishing unit 4 is equipped with two waiting units 43 between the respective pairs of platens 41a and 41b. Each waiting unit 43 has a wafer placement table of an upper-lower two-stage structure. Each wafer placement table 431, 432 is connected to a cylinder 434 through an interconnecting member 433. Therefore, the wafer placement tables 431 and 432 can move linearly when the cylinder 434 drives them.

The polishing unit 4 further includes a spindle-washing unit 44 in a space below the waiting unit 43. The spindle-washing unit 44 is positioned below the lower-stage wafer placement table 432 and is disposed as a cylindrical tank 441 having a size such that the polishing head 42 as the spindle can enter. Washing water is supplied into this tank 441.

Injection ports 45 for washing water are disposed at the boundaries between the platens 41a and 41b of the polishing unit 4. In this embodiment, the injection ports 45 for washing water for washing the wafer 10 are disposed at the boundary with the waiting unit 43 and inside the atmosphere of the platens 41a on,both right and left sides in order to jet washing waster when the wafer 10 is conveyed from the polishing work by the platens 41a on both right and left sides to the polishing work by the platen 41b at the center.

The operation of this polishing unit 4 will be explained for the case of two-step polishing. When the wafer 10 carried by the upper-stage transfer robot 31 of the load/unload unit 3 is put on the upper-stage placement table 431 of the waiting unit 43, the rod-less cylinder 434 of the upper-stage wafer placement table 431 operates and linearly moves the wafer 10 on the upper-stage wafer placement table 431 to the position at which it is delivered to the polishing head 42.

Next, the polishing head 42 moves, holds the wafer 10 on the upper-stage wafer placement table 431 by vacuum adsorption or the like, and carries the wafter 10 to one of the right and left platens 41a, where a first polishing of the wafer 10, is conducted.

After the first polishing is complete, the wafer 10 is carried to the next platen 41b at the center having different polishing characteristics while the wafer 10 remains kept by the polishing head 42. In the interim, washing water jetted from the injection port 45 washes away the slurry, or the like, adhering to the wafer 10 and the polishing head 42. Incidentally, the polishing head 42 may be immersed in washing water inside the tank 441 and may be further washed, whenever necessary. At this time, the upper-stage and lower-stage wafer placement tables 431 and 432 naturally move away from the position above the spindle-washing unit 44.

The center platen 41b having different polishing characteristics by using different slurries, for example, applies the next polishing to the wafer 10 carried to the center platen 41b. After polishing is complete, the polishing head 42 carries the wafer 10 onto the lower stage placement table 432 of the waiting unit 43 that has moved already. Next, the cylinder 34 operates and moves the lower-stage wafer placement table 432 supporting thereon the wafer 10 after two-step polishing to the original delivery position to the load/unload unit 3. The lower-stage transfer robot 32 of the load/unload unit 3 receives the wafer 10 after two-step polishing from the lower-stage wafer placement table 432 and carries it to the next washing unit 5.

The wafer polishing apparatus according to the present invention explained above can wash away the slurry, etc, adhering to the wafer during the process in which the wafer after the first polishing is transferred to the platen having different polishing characteristics, and can therefore conduct high-precision two-step polishing. The wafer polishing apparatus of the present invention can prevent the slurry, etc, adhering to the wafer from being carried into the next platen, and can thus prevent the decrease in the degree of cleanness of the next platen due to contamination from the slurry, etc.

While the present invention has thus been described by reference to a specific embodiment chosen for purposes of illustration, it should be apparent that numerous modifications could be made thereto by those skilled in the art without departing from the basic concept and scope of the invention.

What is claimed is:

1. A wafer polishing apparatus comprising an index unit for delivering a wafer from a cassette to a load/unload unit, the apparatus comprising an upper transfer robot and a lower transfer robot, said load/unload unit relaying said wafer from said index unit to a polishing unit adjacent to said load/unload unit, and from said polishing unit to a washing unit, wherein said polishing unit polishes said wafer and wherein said washing unit washes said wafer after it is polished, wherein said polishing unit comprises three platens arranged in line and two waiting units each having a wafer placement table having an upper stage and lower stage structure arranged between respective pairs of adjacent platens, and injection ports for jetting washing fluid for washing said wafer moved by a polishing head, the injection ports being disposed between said platens and said waiting units, wherein said wafer is polished by one of said platens and is further polished by the other of said platens having different polishing characteristics.

* * * * *